United States Patent [19]

Byun et al.

[11] Patent Number: 5,744,398

[45] Date of Patent: Apr. 28, 1998

[54] METHOD OF FORMING ELECTRODE OF SEMICONDUCTOR DEVICE

[75] Inventors: Jeong Soo Byun; Byung Hak Lee, both of Chungcheongbuk-do, Rep. of Korea

[73] Assignee: IG Semicon Co., Ltd., Chungcheongbuk-do, Rep. of Korea

[21] Appl. No.: 788,107

[22] Filed: Jan. 23, 1997

[30] Foreign Application Priority Data

Jul. 31, 1996 [KR] Rep. of Korea .................. 1996/31654

[51] Int. Cl.⁶ .............................. H01L 21/44; H01L 21/48
[52] U.S. Cl. ...................... 438/592; 438/655; 438/659
[58] Field of Search ................... 437/29, 41 GS, 437/44, 45, 40 GS, 192, 193, 196, 200; 148/DIG. 147; 438/592, 655, 659

[56] References Cited

U.S. PATENT DOCUMENTS

| | | | |
|---|---|---|---|
| 4,282,647 | 8/1981 | Richman | 437/200 |
| 5,210,043 | 5/1993 | Hosaka | 437/200 |
| 5,525,543 | 6/1996 | Chen | 437/200 |

OTHER PUBLICATIONS

Young–Wug Kim et al., "Microstructures of Tungsten Silicide Films Deposited by CVD and by Sputtering", Semiconductor R&D Center, Samsung Electronics Co., Ltd.,: 1–6.

T.H. Tom Wu et al., "Properties of $Wsi_x$ using dichlorosilane in a single-wafer system", J. Vac. Sci. Technol. B6(6): 1707–1713 (1988).

S.G. Telford et al., "Chemically Vapor Deposited Tungsten Silicide Films Using Dichlorosilane in a Single-Wafer Reactor", J. Electrochem. Soc., 140(12): 3689–3701 (1993).

*Primary Examiner*—Brian Dutton
*Attorney, Agent, or Firm*—Morgan, Lewis & Bockius LLP

[57] ABSTRACT

A method of forming an electrode of a semiconductor device includes the steps of forming an insulating layer on a semiconductor substrate, forming a tungsten silicide layer on the insulating layer, implanting impurity ions into the tungsten silicide layer to form an impurity region in a lower portion of the tungsten silicide layer, and carrying out a heat treatment to the substrate on which the tungsten silicide layer is formed.

27 Claims, 4 Drawing Sheets

METHOD OF FORMING ELECTRODE OF SEMICONDUCTOR DEVICE

BACKGROUND OF THE INVENTION

1. Field of the Invention

The present invention relates to a method of fabricating a semiconductor device, and more particularly, to a method of forming an electrode of a semiconductor device.

2. Discussion of the Related Art

A conventional method of forming an electrode of a semiconductor device will be explained below with reference to FIGS. 1A to 1D. As shown in FIG. 1A, a first oxide layer 3 and a polysilicon layer 4 are sequentially formed on a silicon substrate 1 on which an active region is defined by a field oxide layer 2. Here, the first oxide layer 3 is formed with a thickness of about 80 Å through a thermal oxidation. The polysilicon layer 4 is preferably formed of doped polysilicon with a thickness of about 1000 Å.

Then, as shown in FIG. 1B, a tungsten silicide (WSix) layer 5 and a second oxide layer 6 are sequentially formed on the polysilicon layer 4 through chemical vapor deposition (CVD). Here, the tungsten silicide layer 5 is formed with a thickness of about 1000 Å, and the second oxide layer 6 is formed with a thickness of about 1500 Å. As shown in FIG. 1C, the second oxide layer 6, the tungsten silicide layer 5, the polysilicon layer 4, and the first oxide layer 3 are patterned to form a gate electrode on the active region of the substrate 1. As shown in FIG. 1D, impurity ions are implanted into substrate 1 using the gate electrode as a mask to form source and drain regions 7 at the upper portion of the substrate 1 and located at both sides of the gate electrode.

However, the conventional method has the following problems. First, the polysilicon and tungsten silicide causes the gate electrode to be thick. This increases its resistance. Second, the formation of the gate electrode requires a two-step process in which the polysilicon layer is formed and then the tungsten silicide layer is deposited thereon. Thus, the formation process is complicated.

SUMMARY OF THE INVENTION

Accordingly, the present invention is directed to a method of forming an electrode of a semiconductor device that substantially obviates one or more of the problems due to limitations and disadvantages of the related art.

An object of the present invention is to provide a simplified process of forming an electrode of a semiconductor device.

Another object of the present invention is to provide a method of forming an electrode having a lower resistance value.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method of forming an electrode of a semiconductor device includes the steps of forming an insulating layer on a semiconductor substrate, forming a tungsten silicide layer on the insulating layer, implanting impurity ions into the tungsten silicide layer to form an impurity region in a lower portion of the tungsten silicide layer, and carrying out heat treatment to the substrate on which the tungsten silicide is formed. It is preferable that the tungsten silicide layer is WSix (2.0<x<3.0). The impurity ion is preferably one of $BF_2^+$, $B^+$, $P^+$ and $As^+$. The heat treatment is carried out under an ambient of $N_2$, $NH_3$ or $O_2$.

In another aspect of the present invention, a method of forming an electrode of a semiconductor device includes the steps of sequentially forming a first insulating layer and a tungsten silicide layer on a semiconductor substrate; implanting first impurity ions into the tungsten silicide layer to form an impurity region in a lower portion of the tungsten silicide layer; carrying out a heat treatment on the substrate and the tungsten silicide layer; forming a second insulating layer on the tungsten silicide layer; patterning the first and second insulating layers and the tungsten silicide layer to form a gate electrode on a portion of the semiconductor substrate; and implanting second impurity ions into the semiconductor substrate using the gate electrode as a mask to form source and drain regions in upper portions of the semiconductor substrate at sides of the gate electrode.

In a further aspect of the present invention, a method of forming an electrode of a semiconductor device includes the steps of implanting first impurity ions into a semiconductor substrate to form a first impurity region at an upper portion of the substrate; forming an insulating layer on the substrate; forming a contact hole in the insulating layer to expose a predetermined portion of the substrate where the first impurity region is formed; forming a tungsten silicide layer on the insulating layer and the exposed portion of the substrate; implanting second impurity ions into the tungsten silicide layer to form a second impurity region at lower portion of the tungsten silicide layer; and carrying out a heat treatment on the substrate and the tungsten silicide layer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

Figure 1A:
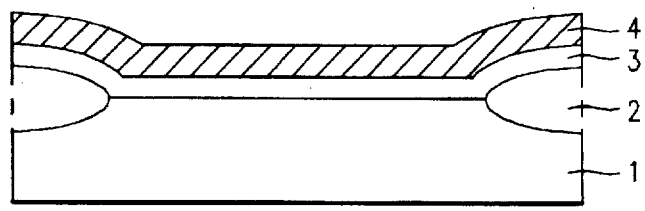
FIGS. 1A to 1D are cross-sectional views showing a conventional method of forming an electrode of a semiconductor device.
Figure 1B:
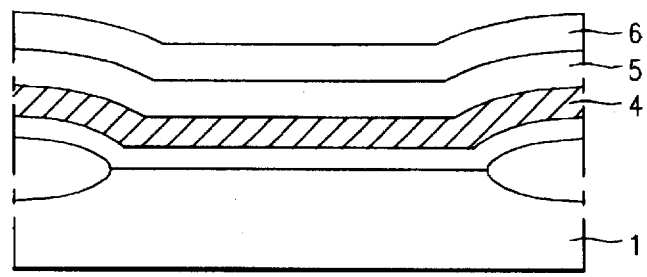
Figure 1C:
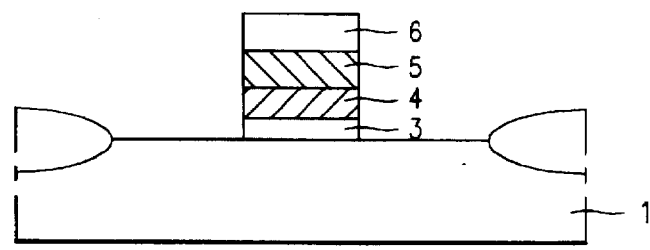
Figure 1D:
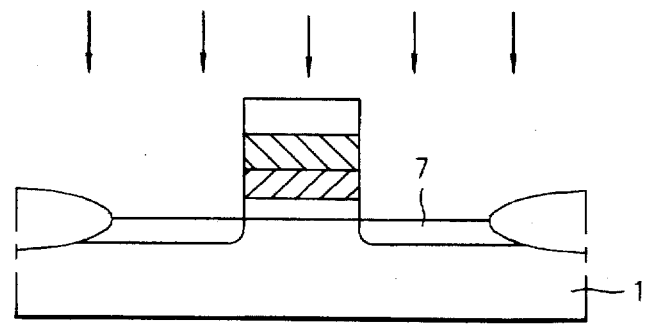
Figure 2A:
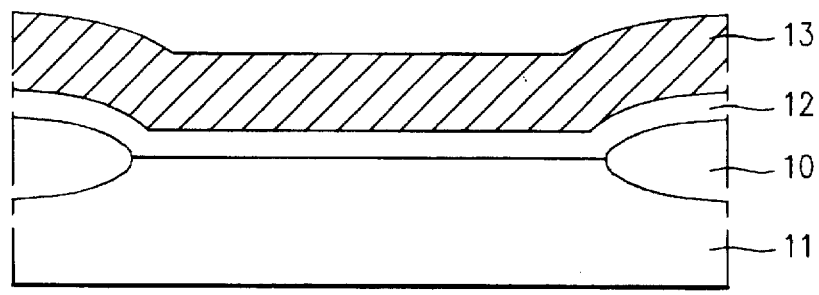
FIGS. 2A to 2E are cross-sectional views showing a process of forming an electrode of a semiconductor device according to a first embodiment of the present invention.

FIGS. 2A to 2E are cross-sectional views showing a process of forming an electrode of a semiconductor device according to a first embodiment of the present invention. Referring to FIG. 2A, a first oxide layer 12 and a tungsten silicide layer 13 are sequentially formed on a silicon substrate 11. A field oxide layer 10 defines an active region on the substrate 11. Here, the first oxide layer 12 is formed with a thickness of about 80 Å through a thermal oxidation. The tungsten silicide layer 13 is formed in such a manner that WSix (2.0<x<3.0) is deposited on the first oxide layer 12 with a thickness of about 1400 Å to 1600 Å through chemical vapor deposition(CVD), employing $SiH_2Cl_2$ and $WF_6$ as a source gas, for example.

Figure 2B:
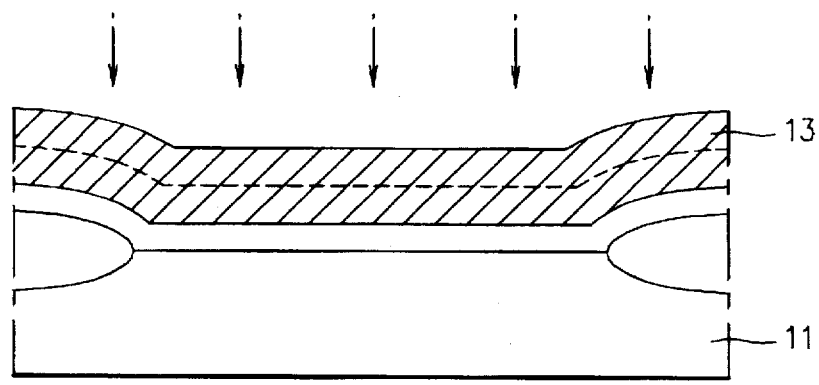

Referring to FIG. 2B, impurity ions are implanted into the tungsten silicide layer 13 to form an impurity region in the lower portion of the tungsten silicide layer 13. The impurity ions can be of either N-type or P-type impurity. For example, $BF_2^+$, $B^+$, $P^+$ or $As^+$ may be used for the impurity ion implantation. The impurity ion implantation is preferably carried out with a dose of about $5 \times 10^{15} cm^{-2}$ with an energy of about 15 KeV.

Figure 2C:
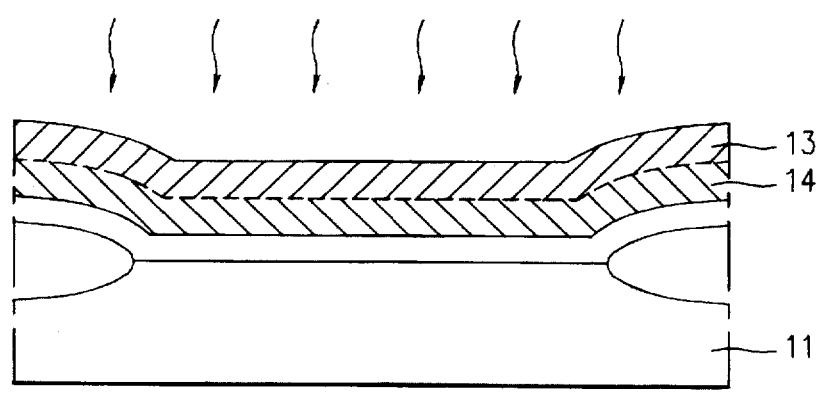

Referring to FIG. 2C, the substrate 11 and the tungsten silicide layer 13 formed thereon are heat-treated at a temperature of around 850° C. to 950° C. for about 30 minutes. The heat treatment is preferably performed under an ambient of $N_2$, $NH_3$ or $O_2$. Silicon atoms contained in the tungsten silicide layer 13 are diffused into the lower portion of the tungsten silicide layer 13 and positioned closely to the substrate 11. Since the lower portion of tungsten silicide layer 13 is already doped with impurities, this portion becomes a doped polysilicon layer 14 due to the diffused silicon atoms. In other words, when the tungsten silicide layer 13 is heat-treated, a polysilicon layer 14 with a thickness of about of 200 Å to 300 Å is formed. The remaining tungsten silicide layer 13 is about 1200 Å thick.

Figure 2D:
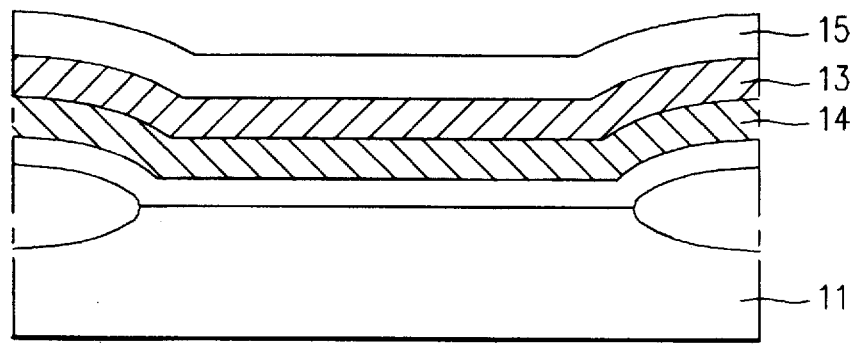
Figure 2E:
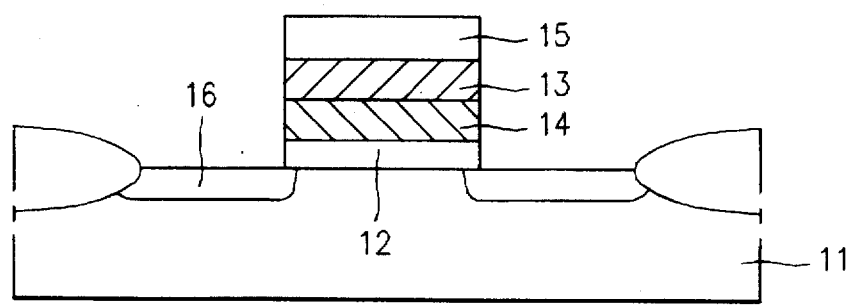

Referring to FIG. 2D, a second oxide layer 15 is formed on the tungsten silicide layer 13 with a thickness of about 1500 Å. Then, as shown in FIG. 2E, the first and second oxide layers 12 and 15, the tungsten silicide layer 13, and doped polysilicon layer 14 are patterned to form a gate electrode on a predetermined portion of the substrate 11. Impurity ions are implanted into the substrate using the gate electrode as a mask to form source and drain regions 16 at predetermined upper portions of the substrate 1 and at both sides of the gate electrode.

Figure 3A:
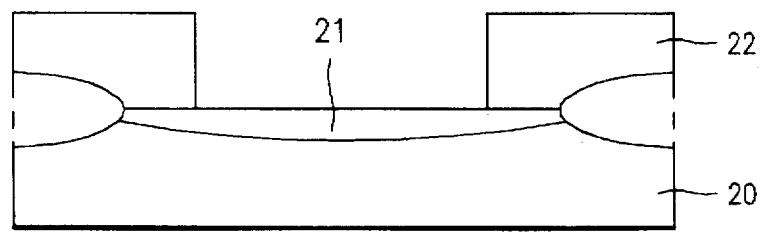
FIGS. 3A, 3B and 3C are cross-sectional views showing a process of forming an electrode of a semiconductor device according to a second embodiment of the present invention.
Figure 3B:
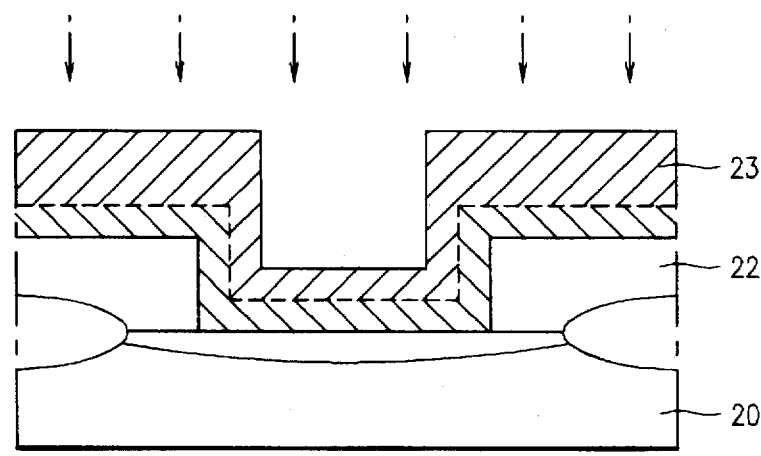
Figure 3C:
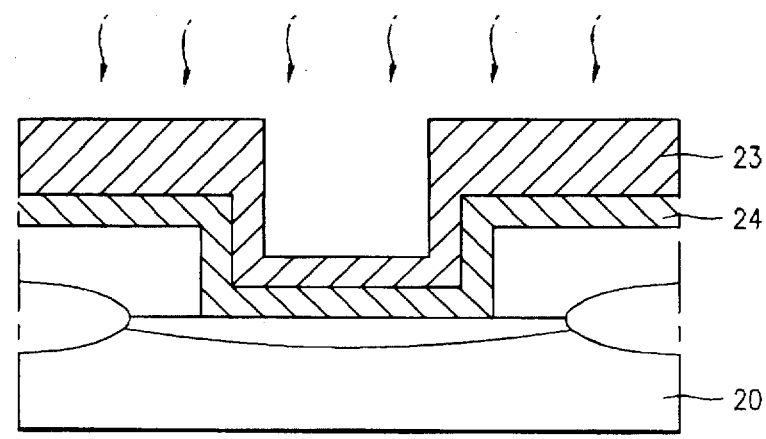

FIGS. 3A, 3B and 3C are cross-sectional views showing a process of forming an electrode of a semiconductor device according to a second embodiment of the present invention. Referring to FIG. 3A, a field oxide layer is formed on a silicon substrate 20 to define an active region. A first impurity implantation is performed by implanting impurity ions into the silicon substrate 20 to form a first impurity region 21 at a predetermined upper portion of the substrate 20. An oxide layer 22 is formed on the overall surface of the substrate, and selectively removed to form a contact hole to expose a predetermined portion of the substrate 20 where the first impurity region 21 is formed.

Referring to FIG. 3B, a tungsten silicide layer 23 is formed on the overall surface of the oxide layer 22 including the exposed portion of the substrate 20. Then, a second implantation is performed by implanting impurity ions into the tungsten silicide layer 23 to form a second impurity region in the lower portion of the tungsten silicide layer 23. Here, the tungsten silicide layer 23 is formed in such a manner that WSix (2.0<x<3.0) is deposited with a thickness of about 1400 Å to 1600 Å through CVD employing $SiH_2Cl_2$ and $WF_6$ as a source gas, for example. The type of impurity ions for the second implantation can be of N-type or P-type impurity. For example, $BF_2^+$, $B^+$, $P^+$ or $As^+$ may be used for the second impurity implantation. The second impurity ion implantation is preferably carried out with a dose of about $5 \times 10^{15} cm^{-2}$ with an energy of about 15 KeV.

Referring to FIG. 3C, the substrate 20 and the tungsten silicide layer 23 formed thereon are heat-treated at a temperature of about 850° C. to 950° C. for about 30 minutes. The heat treatment is preferably performed under an ambient of $N_2$, $NH_3$ or $O_2$. Silicon atoms contained in the tungsten silicide layer 23 are diffused into the lower portion of the tungsten silicide layer 23, and positioned closely to substrate 20. Since the lower portion of the tungsten silicide layer 23 is already doped with impurities, this portion becomes a doped polysilicon layer 24 due to the diffused silicon atoms. In other words, when the tungsten silicide layer 23 is heat-treated, a polysilicon layer 24 with a thickness of about 200 Å to 300 Å is formed. The remaining tungsten silicide layer 23 is about 1200 Å thick.

As described above, the present invention has the following advantages. First, since the gate electrode is thinner than that of the conventional device and the tungsten silicide layer is thicker than that of the conventional device, the resistance of the gate line is reduced. This leads to improved conductivity. Second, since only one tungsten silicide layer is formed and heat-treated to form the gate electrode, the present invention is a simplified one-step process.

It will be apparent to those skilled in the art that various modifications and variations can be made in the method of forming an electrode of the present invention without departing from the spirit or scope of the invention. Thus, it is intended that the present invention cover the modifications and variations of this invention provided they come within the scope of the appended claims and their equivalents.

What is claimed is:

1. A method of forming an electrode of a semiconductor device, the method comprising the steps of:

forming an insulating layer on a semiconductor substrate;

forming a tungsten silicide layer on the insulating layer;

implanting impurity ions into the tungsten silicide layer to form an impurity region in a lower portion off the tungsten silicide layer; and carrying out a heat treatment on the substrate and the tungsten silicide layer to form a polysilicon layer in a portion of the tungsten silicide layer adjacent the substrate.

2. The method as claimed in claim 1, wherein the tungsten silicide layer is formed with WSix, where 2.0<x<3.0.

3. The method as claimed in claim 1, wherein the impurity ions in the implanting step include one of $BF_2^+$, $B^+$, $P^+$ and $As^+$ ions.

4. The method as claimed in claim 1, wherein the heat treatment is carried out at a temperature in a range of approximately 850° C. to 950° C.

5. The method as claimed in claim 1, wherein the heat treatment is carried out under an ambient of $N_2$, $NH_3$ or $O_2$.

6. The method as claimed in claim 1, wherein the heat treatment is carried out for about 30 minutes.

7. A method of forming an electrode of a semiconductor device, the method comprising the steps of:

sequentially forming a first insulating layer and a tungsten silicide layer on a semiconductor substrate;

implanting first impurity ions into the tungsten silicide layer to form an impurity region in a lower portion of the tungsten silicide layer;

carrying out a heat treatment on the substrate and the tungsten silicide layer;

forming a second insulating layer on the tungsten silicide layer;

patterning the first and second insulating layers and the tungsten silicide layer to form a gate electrode on a portion of the semiconductor substrate; and implanting second impurity ions into the semiconductor substrate using the gate electrode as a mask to form source and drain regions in upper portions of the semiconductor substrate at sides of the gate electrode.

8. The method as claimed in claim 7, wherein the tungsten silicide layer is formed with WSix, where $2.0<x<3.0$.

9. The method as claimed in claim 7, wherein the tungsten silicide layer is formed through chemical vapor deposition.

10. The method as claimed in claim 7, wherein the tungsten silicide layer is formed with a thickness of approximately 1400 Å to 1600 Å.

11. The method as claimed in claim 7, wherein the first impurity ions are one of N-type and P-type.

12. The method as claimed in claim 7, wherein the first impurity ions include one of $BF_2^+$, $B^+$, $P^+$ and $As^+$ ions.

13. The method as claimed in claim 7, wherein the first impurity ions are implanted with a dose of about $5 \times 10^{15} cm^{-2}$ with an energy of about 15 KeV.

14. The method as claimed in claim 7, wherein the heat treatment is carried out at a temperature in a range of about 850° C. to 950° C.

15. The method as claimed in claim 7, wherein the heat treatment is carried out under an ambient of $N_2$, $NH_3$ or $O_2$.

16. The method as claimed in claim 7, wherein the heat treatment is carried out for about 30 minutes.

17. The method as claimed in claim 7, wherein the step of carrying out a heat treatment forms a polysilicon layer in a portion of the tungsten silicide layer adjacent the substrate.

18. A method of forming an electrode of a semiconductor device, the method comprising the steps of:

implanting first impurity ions into a semiconductor substrate to form a first impurity region at an upper portion of the substrate;

forming an insulating layer on the substrate;

forming a contact hole in the insulating layer to expose a portion of the substrate where the first impurity region is formed;

forming a tungsten silicide layer on the insulating layer and the exposed portion of the substrate;

implanting second impurity ions into the tungsten silicide layer to form a second impurity region at a lower portion of the tungsten silicide layer; and carrying out a heat treatment on the substrate and the tungsten silicide layer to form a polysilicon layer in a portion of the tungsten silicide layer adjacent the substrate.

19. The method as claimed in claim 18, wherein the tungsten silicide layer is formed with WSix, where $2.0<x<3.0$.

20. The method as claimed in claim 18, wherein the tungsten silicide layer is formed through chemical vapor deposition.

21. The method as claimed in claim 18, wherein the tungsten silicide layer is formed with a thickness of approximately 1400 Å to 1600 Å.

22. The method as claimed in claim 18, wherein the second impurity ions are one of N-type and P-type.

23. The method as claimed in claim 19, wherein the second impurity ions include one of $BF_2^+$, $B^+$, $P^+$ and $As^+$ions.

24. The method as claimed in claim 18, wherein the second impurity ions are implanted with a dose of about $5 \times 10^{15} cm^{-2}$ with an energy of about 15 KeV.

25. The method as claimed in claim 18, wherein the heat treatment is carried out at a temperature of about 850° C. to 950° C.

26. The method as claimed in claim 18, wherein the heat treatment is carried out under an ambient of $N_2$, $NH_3$ or $O_2$.

27. The method as claimed in claim 18, wherein the heat treatment is carried out for about 30 minutes.

* * * * *

UNITED STATES PATENT AND TRADEMARK OFFICE
CERTIFICATE OF CORRECTION

PATENT NO. : 5,744,398
DATED : April 28, 1998
INVENTOR(S) : Byun et al.

It is certified that error appears in the above-identified patent and that said Letters Patent is hereby corrected as shown below:

Title page, item [73]:
Assignee change, "IG Semicon Co., Ltd." to --LG Semicon Co., Ltd.--.

Column 6, line 24, change "claim 19" to --claim 18--.

Column 6, line 26, change "As$^+$ions" to --As$^+$ ions--.

Signed and Sealed this

Sixteenth Day of February, 1999

Attest:

Attesting Officer

*Acting Commissioner of Patents and Trademarks*